United States Patent
Lee et al.

(10) Patent No.: US 7,842,441 B2
(45) Date of Patent: Nov. 30, 2010

(54) NORBORNENE POLYMER FOR PHOTORESIST AND PHOTORESIST COMPOSITION COMPRISING THE SAME

(75) Inventors: Jae Jun Lee, Gyeonggi-do (KR); Do Yun Kim, Gyeonggi-do (KR); Myung Sup Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 12/272,168

(22) Filed: Nov. 17, 2008

(65) Prior Publication Data

US 2009/0075207 A1   Mar. 19, 2009

Related U.S. Application Data

(63) Continuation of application No. 11/209,618, filed on Aug. 24, 2005, now abandoned.

(30) Foreign Application Priority Data

Feb. 18, 2005   (KR) ...................... 10-2005-0013600

(51) Int. Cl.
*G03F 7/30* (2006.01)
(52) U.S. Cl. ...................... 430/20; 430/270.1; 430/326; 430/330; 430/905
(58) Field of Classification Search .................. 430/20, 430/326, 330, 270.1, 910
See application file for complete search history.

(56) References Cited

U.S. PATENT DOCUMENTS

| 4,991,628 | A  | 2/1991  | Mäkelä et al. |
| 6,579,658 | B2 | 6/2003  | Hatakeyama et al. |
| 6,673,515 | B2 | 1/2004  | Nishi et al. |
| 6,710,148 | B2 | 3/2004  | Harada et al. |
| 6,824,955 | B2 | 11/2004 | Harada et al. |
| 6,861,197 | B2 | 3/2005  | Harada et al. |
| 6,872,514 | B2 | 3/2005  | Harada et al. |
| 6,916,592 | B2 | 7/2005  | Harada et al. |
| 6,962,767 | B2 | 11/2005 | Watanabe et al. |

*Primary Examiner*—John S Chu
(74) *Attorney, Agent, or Firm*—Cantor Colburn LLP

(57) ABSTRACT

Disclosed herein is a photoresist composition which includes a norbornene copolymer having an epoxy group, an acid generator, and an organic solvent. The norbornene polymer shows superior mechanical and thermal properties, high transparency, excellent insulating properties, and particularly, improved mechanical properties due to the presence of an epoxy group. The photosensitive resin composition shows superior performance, e.g., transparence, developing properties, residual film characteristics, chemical resistance, heat resistance, and flatness. Particularly, since the photosensitive resin composition enables easy formation of a pattern as an interlayer insulating film and shows a high light transmittance even when being formed into a thin film with a relatively large thickness, it is suitable for the production of an interlayer insulating film used in the fabrication processes of LCDs.

8 Claims, 1 Drawing Sheet

NORBORNENE POLYMER FOR PHOTORESIST AND PHOTORESIST COMPOSITION COMPRISING THE SAME

This application is a continuation of application Ser. No. 11/209,618, filed Aug. 24, 2005 which claims priority under 35 U.S.C. §119(a) on Korean Patent Application No. 2005-13600 filed on Feb. 18, 2005, which is herein expressly incorporated by reference.

BACKGROUND OF THE INVENTION

1. Field of the Invention

Embodiments of the present invention relate to a photosensitive resin composition for a photoresist used in the fabrication processes of liquid crystal displays (LCDs), and a photoresist composition comprising the photosensitive resin composition. More particularly, embodiments of the present invention relate to a norbornene copolymer having an epoxy group, and a photoresist composition comprising the norbornene copolymer wherein the composition shows excellent mechanical and thermal properties, superior performance, including insulation, flatness, chemical resistance, etc., ease of pattern formation, high light transmittance, and is thus suitable for the formation of an interlayer insulating film of a device, such as an LCD or integrated circuit device.

2. Description of the Related Art

With the growing demand for liquid crystal display (LCD) panels, particularly, for use in television sets and monitors, glasses and panels are required to be large and to have high resolution, respectively. Under these circumstances, it is necessary to develop photoresists suitable for use in the relevant process conditions satisfying the requirement of glasses. Photo processes conducted on large-size glasses are critical in determining the line throughput and the physical properties of photoresist films, e.g., coating characteristics, spot-free, development contrast, resolution, adhesion to substrates, residual film characteristics and sensitivity, directly influence the quality of microcircuits formed in subsequent processes. Particularly, the sensitivity of photoresists produced during photo processes is an important factor affecting process tact of mass production lines and the high sensitivity of photoresists contributes to the improvement of productivity.

Resists for LDCs most widely used in the present photoresist market are positive-type systems composed of 2,1,5-diazonaphthoquinone (hereinafter, referred to as 'DNQ') and novolac resin, which undergoes photoreaction upon ultraviolet light irritation. The systems undergo a photoreaction due to the presence of DNQ upon being irradiated with light. DNQ is a compound which is insoluble in alkali before light exposure and becomes alkali-soluble upon light exposure. When the alkali-soluble DNQ is developed using an alkaline aqueous solution as a developer, exposed regions are dissolved. On the other hand, novolac resin is inherently alkali-soluble and reacts with the remaining DNQ under alkaline conditions to be crosslinked with the DNQ. Accordingly, the dissolution of the novolac resin is promoted due to the decomposition of the DNQ in exposed regions, but the dissolution of the novolac resin is hampered by the crosslinking between the DNQ and the novolac resin in unexposed regions. As a result, the shape of a mask is exposed during development. The DNQ functions to prevent the dissolution of the highly alkali-soluble novolac resin, and is thus called a "dissolution inhibitor". Such systems are known to have an exposure sensitivity of about from 50 to 100 $mJ/cm^2$. Higher sensitivity is still required for increased throughput and improved reactivity in LCD fabrication processes. To this end, the concept of chemical amplification has been introduced.

Chemically amplified photoresists are comprised of a photoacid generator (PAG) and a polymer combined with a dissolution inhibitor. When the chemically amplified photoresists are exposed to light, the dissolution inhibitor bonded to the skeleton of the polymer is hydrolyzed by the catalytic action of acid generated from the photoacid generator, causing a modification in the polarity of the polymer. The development of the polarity-modified polymer using a polar or non-polar solvent leads to the formation of a positive- or negative-type photosensitive film pattern. As a resin most applicable to these chemically amplified photoresists, a polyvinylphenol protected by a t-butoxycarbonyl group is disclosed in U.S. Pat. No. 4,991,628.

Interlayer insulating films are used to insulate wirings arranged in respective layers of TFT-type liquid crystal displays or integrated circuit devices. The use of photosensitive materials with a small number of processes and superior flatness are required for the production of interlayer insulating films in the shape of desired patterns. The structure of TFT-type liquid crystal display devices varies with an increase in the definition of liquid crystal displays (LCDs). For example, interlayer insulating films often have a large thickness due to their poor insulating properties, but they are required to have improved flatness before use.

However, when photosensitive resin compositions as interlayer insulating films have a large thickness, the transparence of the compositions is inevitably deteriorated with increasing thickness of the films.

OBJECTS AND SUMMARY

Therefore, embodiments of the present invention have been made in view of the above problems of the related art, and it is an object of embodiments of the present invention to provide a photoresist composition with superior mechanical and thermal properties, low dielectric constant, and improved light transmittance.

In accordance with an aspect of the present disclosure for achieving the above object, there is provided a photoresist composition comprising a norbornene copolymer having an epoxy group, an acid generator, and an organic solvent, wherein the norbornene copolymer has a formula selected from Formula 1 or Formula 2 below:

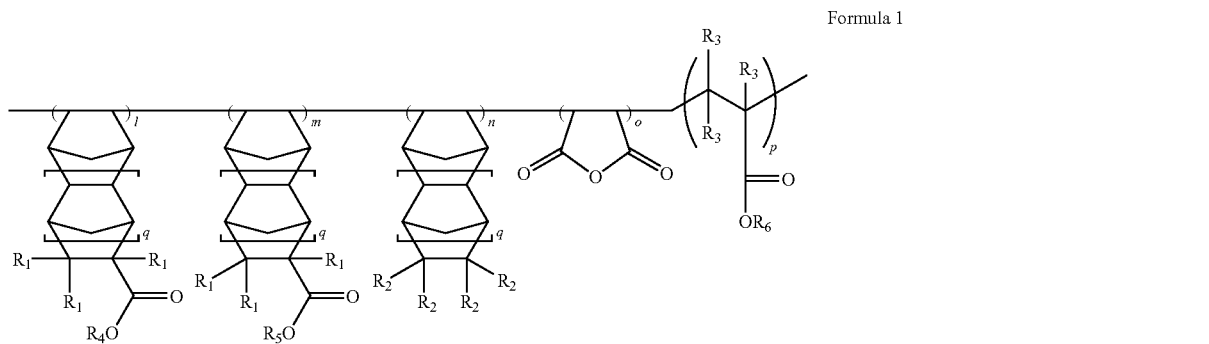

Formula 1 wherein $R_1$ to $R_4$, and $R_6$ are each independently H, F, hydroxyl, or a $C_1$-$C_{30}$ linear or cyclic alkyl, hydroxyalkyl, alkoxy, epoxy, alkoxyalkyl, ester or polycyclic group which may be dissociated or not dissociated by acids;

$R_5$ is a substituted or unsubstituted $C_1$-$C_{30}$ linear or cyclic alkyl or polycyclic group, which contains an epoxy group;

l, m, n, o and p independently satisfy the relations of l+m+n+o+p=1, 0<l<1, 0<m<1, 0≦n<1, 0≦o<1 and 0≦p<1; and q is an integer between 0 to 2,

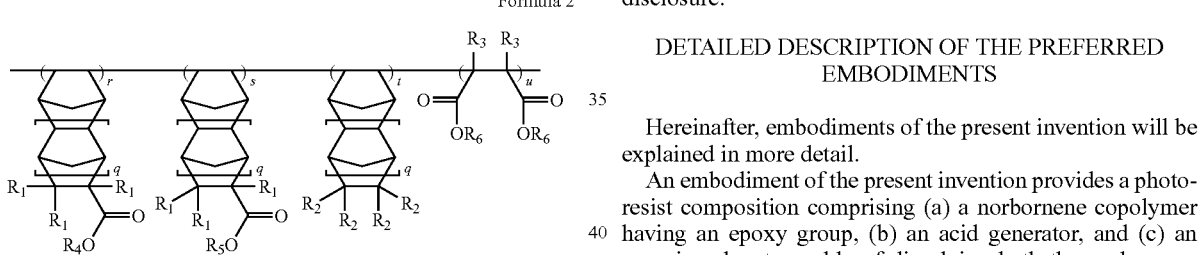

Formula 2 wherein $R_1$ to $R_4$, and $R_6$ are each independently H, F, hydroxyl, or a $C_1$-$C_{30}$ linear or cyclic alkyl, hydroxyalkyl, alkoxy, epoxy, alkoxyalkyl, ester or polycyclic group which may be dissociated or not dissociated by acids;

$R_5$ is a substituted or unsubstituted $C_1$-$C_{30}$ linear or cyclic alkyl or polycyclic group which contains an epoxy group;

r, s, t and u independently satisfy the relations of r+s+t+u=1, 0<r≦1, 0≦s<1, 0≦t<1 and 0<u<1; and q is an integer between 0 to 2.

BRIEF DESCRIPTION OF THE DRAWINGS

The above and other objects, features and other advantages of embodiments of the present invention will be more clearly understood from the following detailed description taken in conjunction with the accompanying drawing, in which.

DETAILED DESCRIPTION OF THE PREFERRED EMBODIMENTS

Figure 1:
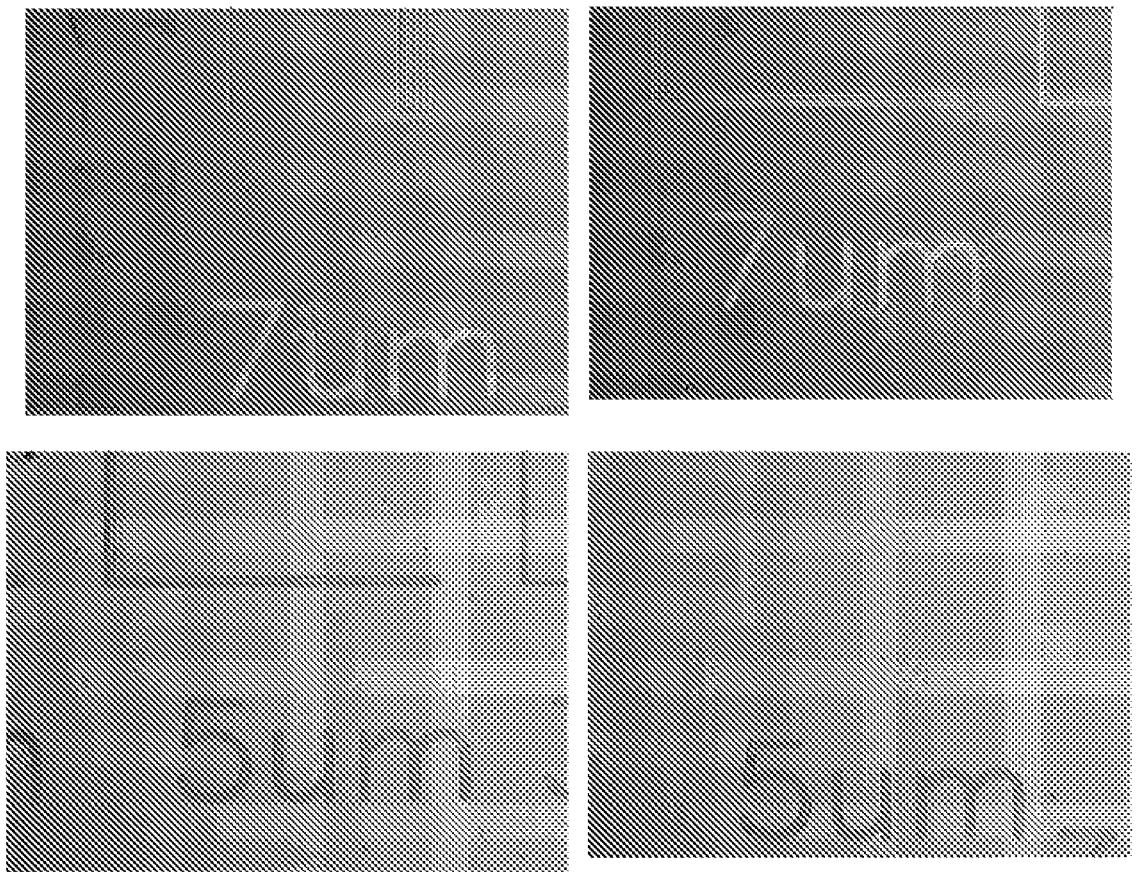
FIG. 1 shows photographs of a fine pattern formed using a photoresist composition prepared in Example 1 of the present disclosure.

Hereinafter, embodiments of the present invention will be explained in more detail.

An embodiment of the present invention provides a photoresist composition comprising (a) a norbornene copolymer having an epoxy group, (b) an acid generator, and (c) an organic solvent capable of dissolving both the norbornene copolymer and the acid generator. The photoresist composition of embodiments of the present invention may be used not only as a chemically amplified photoresist composition, but also as a dissolution inhibition type photoresist composition.

The norbornene copolymer having an epoxy group used in the composition of embodiments of the present invention may have a formula selected from Formula 1 or Formula 2 below:

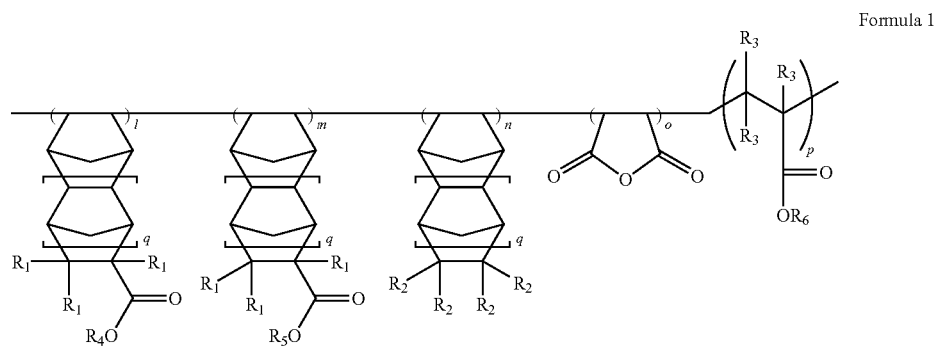

Formula 1 wherein $R_1$ to $R_4$, and $R_6$ are each independently H, F, hydroxyl, or a $C_1$-$C_{30}$ linear or cyclic alkyl, hydroxyalkyl, alkoxy, epoxy, alkoxyalkyl, ester or polycyclic group which may be dissociated or not dissociated by acids;

$R_5$ is a substituted or unsubstituted $C_1$-$C_{30}$ linear or cyclic alkyl or polycyclic group which contains an epoxy group;

l, m, n, o and p independently satisfy the relations of l+m+n+o+p=1, 0<l<1, 0<m<1, 0≦n<1, 0≦o<1 and 0≦p<1; and q is an integer between 0 and 2, Formula 2

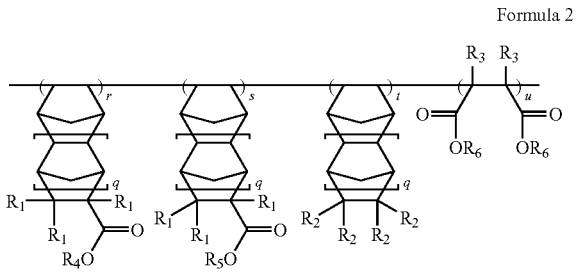

wherein $R_1$ to $R_4$, and $R_6$ are each independently H, F, hydroxyl, or a $C_1$-$C_{30}$ linear or cyclic alkyl, hydroxyalkyl, alkoxy, epoxy, alkoxyalkyl, ester or polycyclic group which may be dissociated or not dissociated by acids;

$R_5$ is a substituted or unsubstituted $C_1$-$C_{30}$ linear or cyclic alkyl or polycyclic group which contains an epoxy group;

r, s, t and u independently satisfy the relations of r+s+t+u=1, 0<r<1, 0≦s<1, 0≦t<1 and 0<u<1; and q is an integer between 0 to 2.

Preferred norbornene photosensitive polymers that may be used in embodiments of the present invention are those wherein, in Formula 1 or 2, $R_4$ is methyl, ethyl, isopropyl, t-butyl, t-amyl, isobornyl, tetrahydropyranyl, naphthalenyl, isomenthyl, tricyclodecanyl, norbornyl, tetracyclododecyl, decalinyl, cyclohexyl, adamantyl, methyladamantyl, ethyladamantyl, or alkoxyalkyl, and particularly t-butyl, alkoxyalkyl, or tetrahydropyranyl. In Formula 1 or 2, $R_5$ contains an epoxy group, for example, glycidyl or oxetanyl.

The norbornene polymer for a photoresist according to embodiments of the present invention may show excellent mechanical and thermal properties, high transparency, low dielectric constant, and excellent mechanical strength due to the presence of an epoxy group, compared to conventional acrylic polymers. The norbornene polymer may be used as a material for a positive-type resist which may be developed with alkali in the presence of a small amount of an acid generator.

The norbornene copolymer has a weight-average molecular weight (Mw) of 1,000-200,000, and preferably 3,000-50,000. When the norbornene copolymer has a weight-average molecular weight of less than 1,000, it may be softened, possibly making the formation of a photoresist thin film difficult. On the other hand, when the norbornene copolymer has a weight-average molecular weight exceeding 200,000, the photoresist thin film tends to be brittle, possibly leading to an unstable pattern. Consequently, it is advantageous in the formation of a stable photoresist thin film that the weight-average molecular weight of the norbornene copolymer according to embodiments of the present invention is within the range defined above.

The content of the norbornene polymer in a photoresist composition of embodiments of the present invention varies depending on the type of the organic solvent, the acid generator used and lithography conditions employed. It is preferred that 10-30 parts by weight of the norbornene polymer are dissolved in 100 parts by weight of the organic solvent.

Photoacid generators that may be used in embodiments of the present invention are compounds capable of generating acids while being dissociated by light. Any known photoacid generators that have been used in the art may be used in embodiments of the present invention. In the case where the photoresist composition of embodiments of the present invention is used as a chemically amplified photoresist composition, an onium salt compound containing a $C_{1-10}$ fluoroalkylsulfonic acid ion as an anion is preferred as the photoacid generator. Examples of the onium salt compound include, but are not limited to, iodonium salts, sulfonium salts, phosphonium salts, diazonium salts, and pyridinium salts. Specific examples of the onium salt compound include di-t-butylphenyliodonium-9,10-diethoxyanthracene-2-sulfonate, diphenyliodonium trifluoromethane sulfonate, diphenyliodonium nonafluoromethane sulfonate, di-(4-t-butylbenzene)iodonium trifluoromethane sulfonate, triphenylsulfonium trifluoromethane sulfonate, triphenylsulfonium nonafluoromethane sulfonate, diphenyl-4-methylphenylsulfonium trifluoromethane sulfonate, triphenylsulfonium p-toluene sulfonate, triphenylsulfonium 10-camphor sulfonate, dimethyl (4-naphthol)sulfonium trifluoromethane sulfonate, dimethyl (4-naphthol)sulfonium p-toluene sulfonate, dimethyl(4,7-dihydroxynaphthalene)sulfonium trifluoromethane sulfonate, dimethyl(4,7-dihydroxynaphthalene)sulfonium 10-camphor sulfonate, dimethyl(4,7-dihydroxynaphthalene) sulfonium p-toluene sulfonate, dimethyl(4,7-dihydroxynaphthalene)sulfonium nonafluoromethane sulfonate, and dimethyl(4,7-dihydroxynaphthalene)sulfonium 3-pyridine sulfonate. These onium salt compounds may be used alone or in combination. The photoacid generator is preferably used in an amount of 1-15 parts by weight, based on 100 parts by weight of the norbornene polymer.

On the other hand, in the case where a photoresist composition of embodiments of the present invention is used as a dissolution inhibition type photoresist composition, a preferred photosensitive compound is one in which a diazonaphthoquinone (DNQ) is bonded to a ballast group having a benzene ring. Specific examples of the diazonaphthoquinone compound include 1,2-quinonediazide-4-sulfonic acid ester, 1,2-quinonediazide-5-sulfonic acid ester, and 1,2-quinonediazide-6-sulfonic acid ester. The diazonaphthoquinone compound may be prepared by esterification of 2-diazo-1-naphthol-5-sulfonic acid with a phenol compound as the ballast group. Specific examples of the phenol compound include 2,3,4-trihydroxybenzophenone, 2,4,6-trihydroxybenzophenone, 2,2',4,4'-tetrahydroxybenzophenone, 2,3,4,3'-tetrahydroxybenzophenone, 2,3,4,4'-tetrahydroxybenzophenone, 2,3,4,2'-tetrahydroxy-4'-methylbenzophenone, 2,3,4,4'-tetrahydroxy-3'-methoxybenzophenone, 2,3,4,2' or 2,3,4,6'-pentahydroxybenzophenone, 2,4,6,3',2,3,6,4' or 2,3,6,5'-hexahydroxybenzophenone, 3,4,5,3',3,4,5,4' or 3,4,5,5'-hexahydroxybenzophenone, bis(2,4-dihydroxyphenyl) methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl) propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, and bis(2,5-dimethyl-4-hydroxyphenyl)-2-hydroxy phenylmethane. These phenol compounds may be used alone or in combination.

The photoacid compound is preferably used in an amount of 5-100 parts by weight and more preferably 10-50 parts by weight, based on 100 parts by weight of the norbornene polymer. When the photoacid compound is used in an amount of less than 5 parts by weight, there may be a small difference in the solubility of exposed and unexposed regions, making the formation of a pattern difficult. Meanwhile, when the photoacid compound is used in an amount exceeding 100 parts by weight, a large amount of the diazo naphthoquinone compound may remain unreacted after light irradiation for a short period of time and thus the solubility in an alkaline aqueous solution may be too low, thereby making the development potentially difficult.

Any organic solvents and mixtures thereof may be used alone or in combination to prepare the photoresist composition of embodiments of the present invention so long as they can be commonly used to prepare photoresist compositions. Examples of organic solvents that may be used in embodiments of the present invention include ethylene glycol monomethyl ether, ethylene glycol monoethyl ether, methyl Cellosolve acetate, ethyl Cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, xyrene, methyl ethyl ketone, cyclohexanone, 2-heptanone, 3-heptanone, and 4-heptanone. In addition to these organic solvents, if necessary, N-methylformamide, N,N-dimethylformamide, N-methylacetamide, N,N-dimethylacetamide, N-methylpyrrolidone, dimethylsulfoxide, triphenylimidazole, alcohol, or the like, may be used as an auxiliary solvent. It is preferable to use the auxiliary solvent in an amount of 10% by weight and less, based on the total weight of the solvents used.

So long as the objects of embodiments of the present invention are not impaired, additives compatible with the photoresist composition of embodiments of the present invention may be further added. Examples of such additives include additional resins for improving the performance of resist films, sensitivity controllers (basic substances), organic acids, plasticizers, preservatives, stabilizers, surfactants, adhesion promoters, colorants, sensitizers, anti-scratching agents, adhesion improvers, and other additives.

The photoresist composition of embodiments of the present invention may be prepared by dissolving the norbornene copolymer of Formula 1 or 2 and a common photoacid generator or compound (PAG or PAC) in the organic solvent in accordance with a common method for the preparation of photoresist compositions, and filtering the solution through an ultrafine filter.

The photoresist composition thus prepared is applied to a substrate by known coating processes, such as spraying, roll coating, spin coating, and the like, to form a photoresist thin film, and is patterned in subsequent processes. Hereinafter, preferred exemplary formation processes of a resist pattern in LCD fabrication will be explained.

A procedure for forming a pattern using a photosensitive resin composition for a chemically amplified photoresist will now be explained. First, a photoresist composition of embodiments of the present invention is applied on top of a glass or silicon wafer substrate, and then pre-baked on a hot plate at 80-150° C. for 1-15 minutes to form a photoresist film. Then, after a mask is positioned on the photoresist film, UV light is irradiated thereon, followed by post-exposure baking (PEB) on a hot plate at 80-150° C. for 1-15 minutes. Thereafter, the resulting film is developed using a developer, e.g., a 0.1-5% (w/w) aqueous tetramethylammonium hydroxide (TMAH) solution, by previously known processes, e.g., dipping, puddling, spraying, and the like, for 30-180 seconds, washed with distilled water for 30-90 seconds to remove unnecessary portions, and dried to form a pattern. The pattern is cured by heating using a heater, e.g., an oven, at 150-250° C. for 30-90 minutes to form the final pattern.

A procedure for forming a pattern using a photosensitive resin composition for a dissolution inhibition type photoresist will now be explained. First, a photoresist composition of embodiments of the present invention is applied on top of a glass or silicon wafer substrate, and then pre-baked on a hot plate at 80-150° C. for 1-15 minutes to form a photoresist film. Then, after a mask is positioned on the photoresist film, UV light is irradiated thereon, followed by development using a developer, e.g., a 0.1-5% (w/w) aqueous tetramethylammonium hydroxide (TMAH) solution, for 30-180 seconds, to form a photoresist pattern. The photoresist pattern is washed with distilled water for 30-90 seconds to remove unnecessary portions, and dried to form a pattern. The pattern is irradiated with UV light, and cured by heating using a heater, e.g., an oven, at 150-250° C. for 30-90 minutes to form the final pattern.

Hereinafter, embodiments of the present invention will be illustrated in more detail with reference to the following examples. However, these examples are given for the purpose of illustration and are not to be construed as limiting the scope of the invention.

Preparative Example 1

Synthesis of Poly(tBN-co-GlyN-co-NB-co-MA)

8.0 g (41.2 mmol) of t-butyl norbornene carboxylate (tBN), 6.42 g (33.1 mmol) of glycidyl norbornene carboxylate (GlyN) prepared by the reaction of 2-chlorocarbonyl-5-norbornene and glycidol, 3.38 g (36.0 mmol) of norbornene (NB), 10.81 g (110.3 mmol) of purified maleic anhydride (MA), and 0.362 g (2.2 mmol) of 2,2'-azobisisobutyronitrile (AIBN) as a polymerization initiator were placed in a polymerization flask, and then 28 g of purified tetrahydrofuran was added thereto. The resulting solution was polymerized under a nitrogen atmosphere at 65° C. for 24 hours, to produce a polymer according to Formula 3, below:

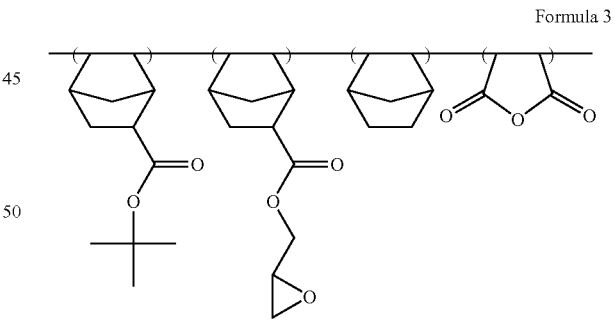

Formula 3

After completion of the polymerization, the polymerization product was precipitated in petroleum ether/ethyl ether, passed through a glass filter, and dried in vacuum at 40° C. for 12 hours, affording 13.73 g (yield: 48%) of the target polymer (Mw=7,590) as a white powder.

Preparative Example 2

Synthesis of Poly(tBN-co-GlyN-co-MA)

15.0 g (77.2 mmol) of t-butyl norbornene carboxylate (tBN), 6.42 g (33.1 mmol) of glycidyl norbornene carboxylate (GlyN), 10.81 g (110.3 mmol) of purified maleic anhydride (MA), and 0.362 g (2.2 mmol) of 2,2'-azobisisobutyronitrile (AIBN) as a polymerization initiator were placed in a polymerization flask, and 33 g of purified tetrahydrofuran was added thereto. The resulting solution was polymerized according to the same procedure as in Preparative Example 1 to give 11.86 g (yield: 37%) of the target polymer (Mw=6,520) as a white solid. The target polymer has a formula according to Formula 4, below:

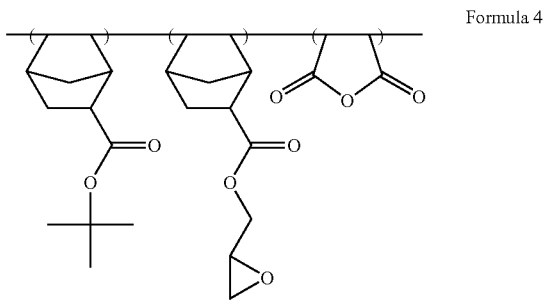

Formula 4

Preparative Example 3

Synthesis of Poly(tBN-co-GlyN-co-NB-co-MA-co-tBMA)

5.0 g (25.7 mmol) of t-butyl norbornene carboxylate (tBN), 6.66 g (34.3 mmol) of glycidyl norbornene carboxylate (GlyN), 3.22 g (34.2 mmol) of norbornene (NB), 8.41 g (85.8 mmol) of purified maleic anhydride (MA), 3.66 g (25.7 mmol) of t-butyl methacrylate, and 0.20 g (1.2 mmol) of 2,2'-azobisisobutyronitrile (AIBN) as a polymerization initiator were placed in a polymerization flask, and 27 g of purified tetrahydrofuran was added thereto. The resulting solution was polymerized according to the same procedure as in Preparative Example 1 to give 18.86 g (yield: 70%) of the target polymer (Mw=10,800) as a white solid. The target polymer has a formula according to Formula 5, below:

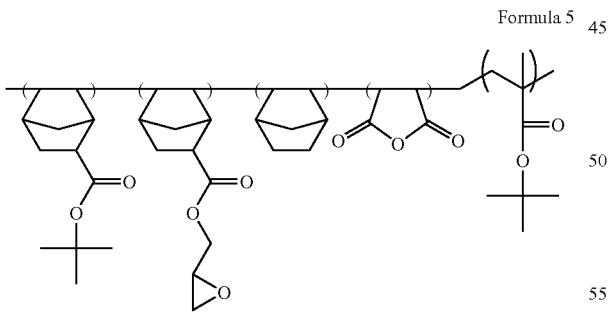

Formula 5

Preparative Example 4

Synthesis of Poly(NCA-co-GlyN-co-NB-co-DEMMA)

2.23 g (16.14 mmol) of 5-norbornene-2-carboxylic acid (NCA), 6.26 g (32.2 mmol) of glycidyl norbornene carboxylate (GlyN), 6.26 g (66.5 mmol) of norbornene (NB), 18.69 g (80.5 mmol) of a maleate monomer (DEMMA) prepared by the reaction of chloromethylethyl ether and maleic acid, and 0.32 g (1.95 mmol) of 2,2'-azobisisobutyronitrile (AIBN) as a polymerization initiator were placed in a polymerization flask, and then 34 g of purified tetrahydrofuran was added thereto. The resulting solution was polymerized according to the same procedure as in Preparative Example 1 to give 14.05 g (yield: 42%) of the target polymer (Mw=6,200) as a white solid. The target polymer has a formula according to Formula 6, below:

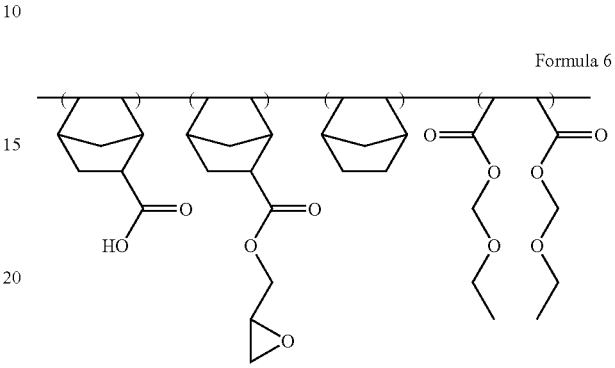

Formula 6

Preparative Example 5

Synthesis of Poly(tBN-co-NB-co-DGlyFA)

10.0 g (51.5 mmol) of t-butyl norbornene carboxylate (tBN), 2.42 g (25.7 mmol) of norbornene (NB), 1.76 g (7.72 mmol) of a fumarate monomer (DGlyFA) prepared by the reaction of glycidol and fumaryl chloride, and 0.14 g (0.85 mmol) of 2,2'-azobisisobutyronitrile (AIBN) as a polymerization initiator were placed in a polymerization flask, and then 28 g of purified tetrahydrofuran was added thereto. The resulting solution was polymerized according to the same procedure as in Preparative Example 1 to give 7.37 g (yield: 52%) of the target polymer (Mw=6,300) as a white solid. The target polymer has a formula according to Formula 7, below:

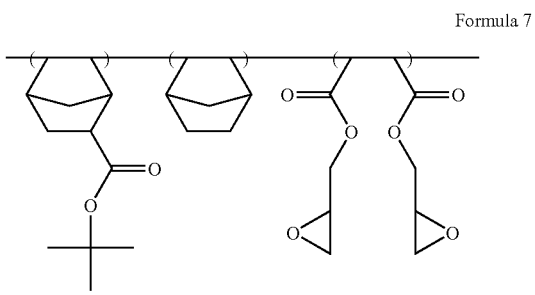

Formula 7

Preparative Example 6

Synthesis of Poly(tBN-o-GlyN-o-NB)

To a clean flask were added 15.0 g (77.2 mmol) of t-butyl norbornene carboxylate (tBN), 5.00 g (25.7 mmol) of glycidyl norbornene carboxylate (GlyN), 2.42 g (25.7 mmol) of norbornene (NB), and 70 ml of dichloromethane. The mixture was bubbled with nitrogen for 5 minutes. Thereafter, 30 mL (0.643 mmol) of a solution of $(\eta^3\text{-allyl})Pd(II)SbF_6$ in dichloromethane was added to the flask. After the flask was completely sealed, the resulting mixture was allowed to react at room temperature for 24 hours. After completion of the polymerization, the polymerization product was precipitated in an excess of methanol, filtered through a glass filter, and dried in vacuum at 40° C. for 12 hours, affording a polymer as a white powder. The polymer was dissolved in tetrahydrofuran, and slowly bubbled with hydrogen for 5 hours. The solution was allowed to stand for 12 hours without stirring so that Pd (0) was agglomerated, and filtered to remove the palladium. The solvent was evaporated under reduced pressure, and methanol was added thereto to obtain a precipitate. The obtained precipitate was dried under a vacuum to give 14.57 g (yield: 65%) of the target polymer (Mw=8,700) as a white solid. The target polymer has a formula according to Formula 8, below:

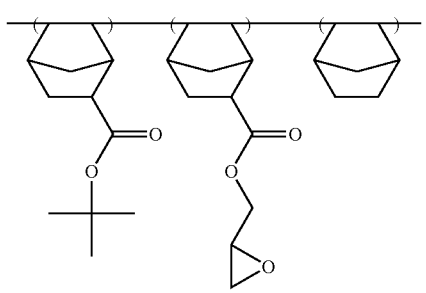

Formula 8

Preparative Example 7

Synthesis of
Poly(MN-co-NCA-co-GlyN-co-NB-co-MA)

8.0 g (52.56 mmol) of methyl norbornene carboxylate (MN), 4.84 g (35.04 mmol) of 5-norbornene-2-carboxylic acid (NCA), 6.81 g (35.04 mmol) of glycidyl norbornene carboxylate (GlyN), 4.95 g (52.56 mmol) of norbornene (NB), 17.18 g (175.2 mmol) of purified maleic anhydride (MA), and 0.575 g (3.5 mmol) of 2,2'-azobisisobutyronitrile (AIBN) as a polymerization initiator were placed in a polymerization flask, and then 42 g of purified tetrahydrofuran was added thereto. The resulting solution was polymerized according to the same procedure as in Preparative Example 1 to give 22.56 g (yield: 54%) of the target polymer (Mw=8,160) as a white solid. The target polymer has a formula according to Formula 9, below:

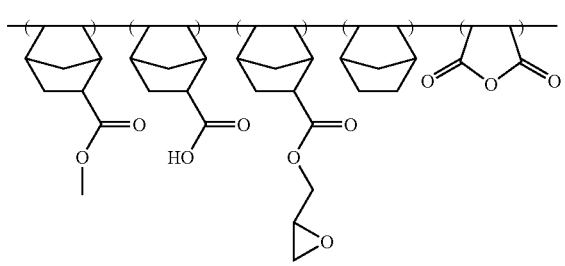

Formula 9

Preparation of Photoresist Compositions and
Formation of Fine Patterns

Example 1

1.0 g of the norbornene polymer protected with a t-butyl group and substituted with an epoxy group, which was prepared in Preparative Example 1, and 0.03 g of triphenylsulfonium triflate as a photoacid generator were dissolved in 3.0 g of propylene glycol monomethyl ether acetate. The solution was filtered through a 0.2 μm syringe filter to prepare a photosensitive resin composition solution. The procedure was performed in a laboratory where far UV light was completely blocked.

A patterned film was produced using the photosensitive resin composition in accordance with the following procedure, and the physical properties of the composition were evaluated by the following methods. The obtained results are shown in Table 1.

The composition solution was spin-coated on a glass substrate at 2,000 rpm, and pre-baked at 120° C. for 90 seconds to form a photoresist film. The photoresist film was exposed to light at an exposure dose of 20-60 mJ/cm$^2$ through a patterned mask, and was subjected to post-exposure baking (PEB) at 120° C. for 90 seconds. The pattern in which latent images were formed was developed using a 2.38% (w/w) aqueous tetramethylammonium hydroxide solution as a developer for 40-60 seconds, and washed with distilled water. Then, the pattern was cured in an oven at 200° C. for 60 minutes to produce a patterned film having a 0.5 micron (μm) line/space pattern. FIG. 1 shows optical micrographs of the positive-type fine pattern formed using the copolymer prepared in Preparative Example 1.

1) Sensitivity was determined as a minimum exposure dose at which the pattern was formed.
2) Resolution was defined as a minimum line size in the patterned film.
3) Residual film rate was evaluated as a difference in the film thickness before and after development.
4) Transparency was evaluated by measuring the light transmittance at 400 nm of the patterned film using a spectrophotometer.
5) Resistance to heat and discoloration was evaluated by measuring a variation in the light transmittance of the patterned film before and after heating the substrate in an oven at 200° C. for 60 minutes. Specifically, the resistance to heat and discoloration was judged to be [O] when the variation was less than 5%, [Δ] when 5-10%, and [X] when higher than 10%.

Examples 2 to 6

Patterned films were produced according to the same procedure as in Example 1, except that the norbornene polymers prepared in Preparative Examples 2 to 6 were used instead of the norbornene polymer prepared in Preparative Example 1. The physical properties were evaluated in the same manner as in Example 1, and the obtained results are shown in Table 1.

Example 7

1.0 g of the norbornene polymer prepared in Preparative Example 7 and 0.2 g of 2,3,4,4'-tetrahydroxybenzophenone-1,2-naphthoquinonediazide-5-sulfonate acting as both a dissolution inhibitor and an acid compound were dissolved in 3.0 g of propylene glycol monomethyl ether acetate. The solution was filtered through a 0.2 μm syringe filter to prepare a photosensitive resin composition solution. The procedure was performed in a laboratory where far UV light was completely blocked. A patterned film was produced using the photosensitive resin composition in accordance with the following procedure, and the physical properties of the composition were evaluated in the same methods as in Example 1. The obtained results are shown in Table 1.

The composition solution was spin-coated on a glass substrate at 2,000 rpm, and pre-baked at 100° C. for 2 minutes to form a photoresist film. The photoresist film was irradiated with UV light at an intensity of 15 mW/cm$^2$ at 365 nm for 20 seconds through a patterned mask. Thereafter, the pattern in which latent images were formed was developed using a 2.38% (w/w) aqueous tetramethylammonium hydroxide solution as a developer for 60 seconds, and washed with distilled water. Then, the pattern was irradiated with UV light at an intensity of 15 mW/cm$^2$ at 365 nm for 30 seconds, and cured in an oven at 200° C. for 60 minutes to produce a patterned film.

TABLE 1

| Ex. No. | Polymer | Sensitivity (mJ/cm$^2$) | Resolution (μm) | Residual film rate (%) | Transparency (%) | Resistance to heat and discoloration |
|---|---|---|---|---|---|---|
| Ex. 1 | Preparative Example 1 | 30 | 5 | 98 | 97 | 0 |
| Ex. 2 | Preparative Example 2 | 35 | 3 | 98 | 98 | 0 |
| Ex. 3 | Preparative Example 3 | 20 | 3 | 97 | 99 | 0 |
| Ex. 4 | Preparative Example 4 | 26 | 3 | 96 | 96 | 0 |
| Ex. 5 | Preparative Example 5 | 40 | 4 | 98 | 97 | 0 |
| Ex. 6 | Preparative Example 6 | 40 | 5 | 99 | 98 | 0 |
| Ex. 7 | Preparative Example 7 | 180 | 5 | 92 | 93 | 0 |

As can be seen from the data shown in Table 1, the compositions using the norbornene derivatives substituted with non-polar photosensitive protecting groups (e.g., t-butyl and ethoxymethyl groups) and the photoacid generators (PAGs) in accordance with embodiments of the present invention are superior in sensitivity, transparency, residual film rate, and heat resistance. Accordingly, compositions of embodiments of the present invention may be applied to the production of interlayer insulating films having a sufficiently large thickness for high flatness. Particularly, compositions of embodiments of the present invention show high sensitivity when compared to the dissolution inhibition type photoresist composition (Example 7) prepared using the PAC as a photosensitizer. Namely, general photosensitive resins which are applied to i-line currently used in semiconductor manufacturing processes have a sensitivity of about 100 mJ/cm$^2$, whereas photosensitive resin compositions of embodiments of the present invention have a high sensitivity of 20-40 mJ/cm$^2$. In addition, since the norbornene polymers of embodiments of the present invention have a higher glass transition temperature than common acrylate polymers, they are expected to maintain the flatness of insulating films at a higher level during curing.

As apparent from the above description, photosensitive resin compositions of embodiments of the present invention show superior performance, e.g., transparence, developing properties, residual film characteristics, chemical resistance, heat resistance, and flatness. Particularly, since photosensitive resin compositions of embodiments of the present invention enable easy formation of a pattern as an interlayer insulating film and shows a high light transmittance even when being formed into a thin film with a relatively large thickness, it is suitable for the production of an interlayer insulating film used in the fabrication processes of LCDs. In addition, since the norbornene polymer has an epoxy group, photosensitive resin compositions of embodiments of the present invention show improved mechanical properties and flatness during curing. Furthermore, even when photoresist compositions of embodiments of the present invention use an acid generator in a smaller amount than conventional dissolution inhibition type photoresist compositions, it may be used to produce an insulating film with high sensitivity and high light transmittance.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a pattern using a photosensitive resin composition comprising:

applying a photoresist composition on top of a substrate, wherein;

the method for fabricating a liquid crystal display which comprises an insulating film, wherein the insulating film is formed from a photoresist composition comprising a norbornene copolymer, an acid generator and an organic solvent, wherein the norbornene copolymer has a formula selected from the group consisting of Formula 3 to 9 below:

Formula 3

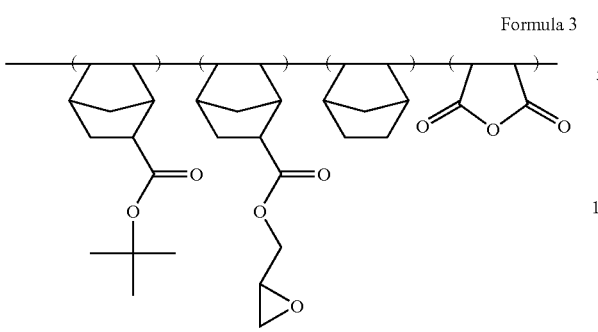

Formula 4

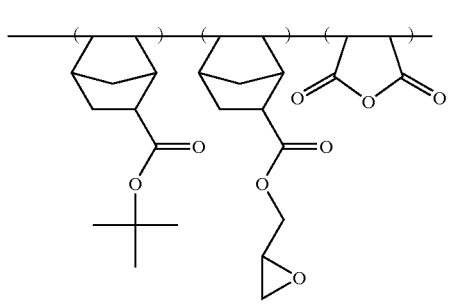

Formula 5

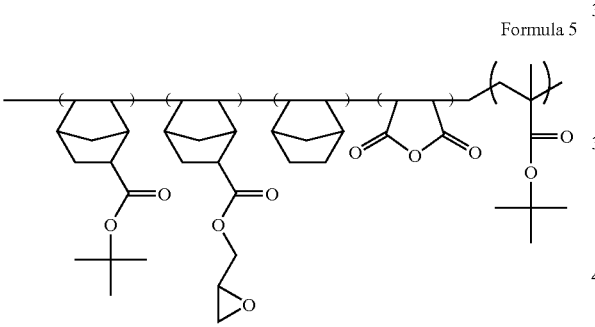

Formula 6

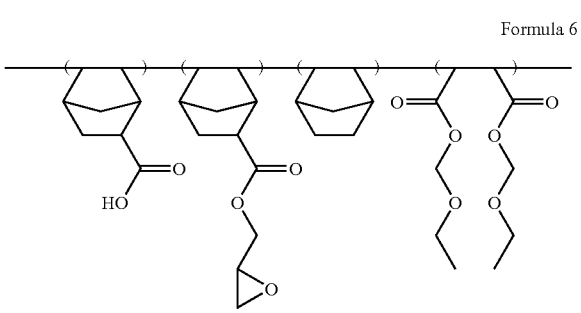

Formula 7

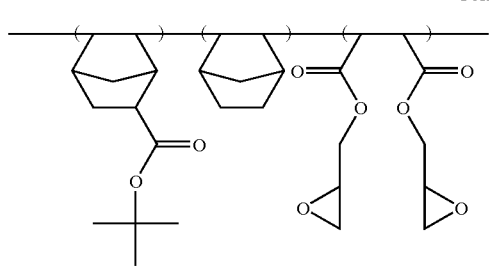

-continued

Formula 8

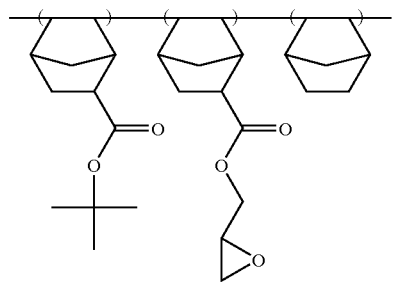

Formula 9

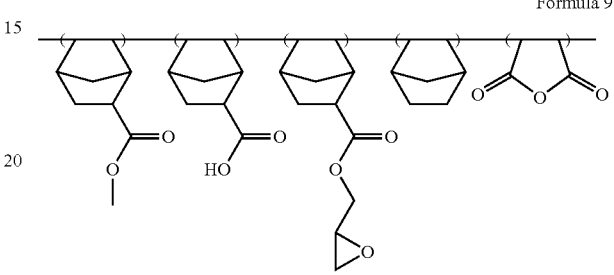

the method comprising the step of:
  forming a pattern using a photosensitive resin composition comprising:
    applying the photoresist composition on top of a substrate;
    pre-baking the photoresist composition and substrate to form a photoresist film;
    irradiating UV light with a mask;
    baking the irradiated photoresist film; and
    developing and washing the resulting pattern.

2. The method according to claim 1, wherein the acid generator comprises an onium salt compound selected from the group consisting of iodonium salts, sulfonium salts, phosphonium salts, diazonium salts, and pyridinium salts.

3. The method according to claim 2, wherein the photoresist composition has 1 to 15 parts by weight of acid generator based on 100 parts by weight of norbornene polymer.

4. The method according to claim 1, wherein the acid generator comprises a photosensitive compound in which a diazonaphthoquinone is bonded to a ballast group having at least one benzene ring.

5. The method according to claim 4, wherein the photoresist composition has 5 to 100 parts by weight of acid generator based on 100 parts by weight of norbornene polymer.

6. The method according to claim 1, further comprising an auxiliary solvent selected from the group consisting of N-methylformamide, N,N-dimethylformamide, N-methylacetamide, N,N-dimethylacetamide, N-methylpyrrolidone, dimethylsulfoxide, triphenylimidazole, and alcohol.

7. The method according to claim 1, further comprising at least one additive selected from the group consisting of resins for improving the performance of resist films, sensitivity controllers, organic acids, plasticizers, preservatives, stabilizers, surfactants, adhesion promoters, colorants, sensitizers, anti-scratching agents, and adhesion improvers.

8. A method for forming a pattern using a photosensitive resin composition comprising:
  applying a photoresist composition on top of a substrate, wherein;
  the method for fabricating a liquid crystal display which comprises an insulating film, wherein the insulating film is formed from a photoresist composition comprising a norbornene copolymer, an acid generator and an organic solvent, wherein the norbornene copolymer has a formula selected from the group consisting of Formula 3 to 9 below:

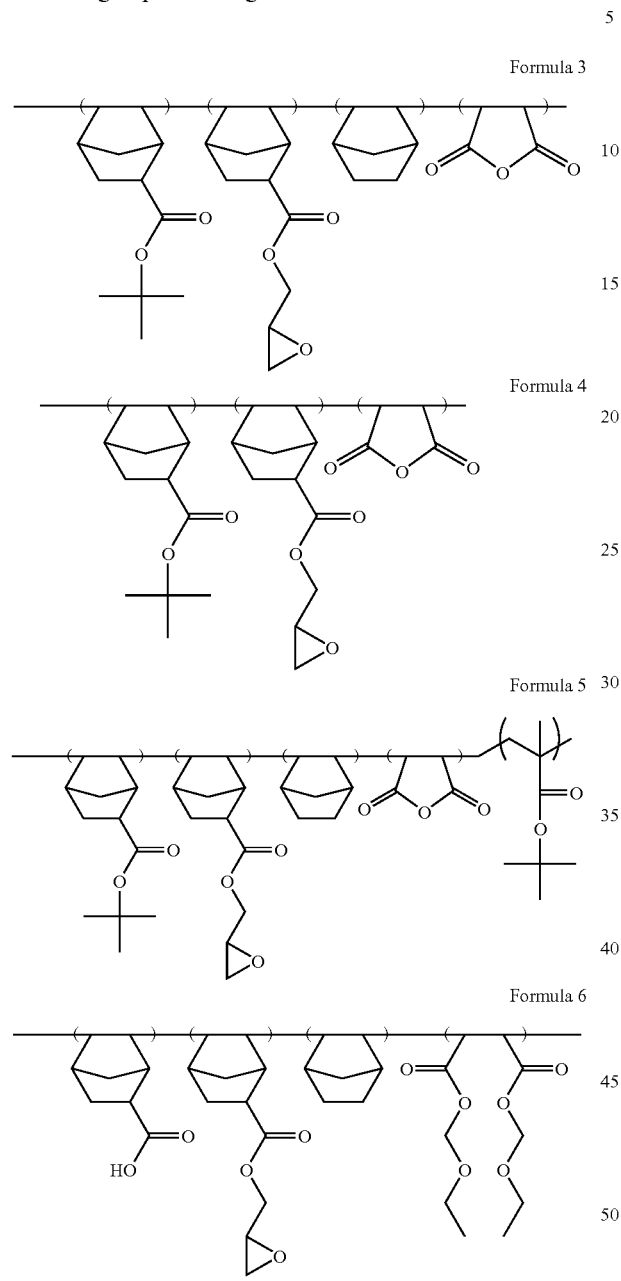

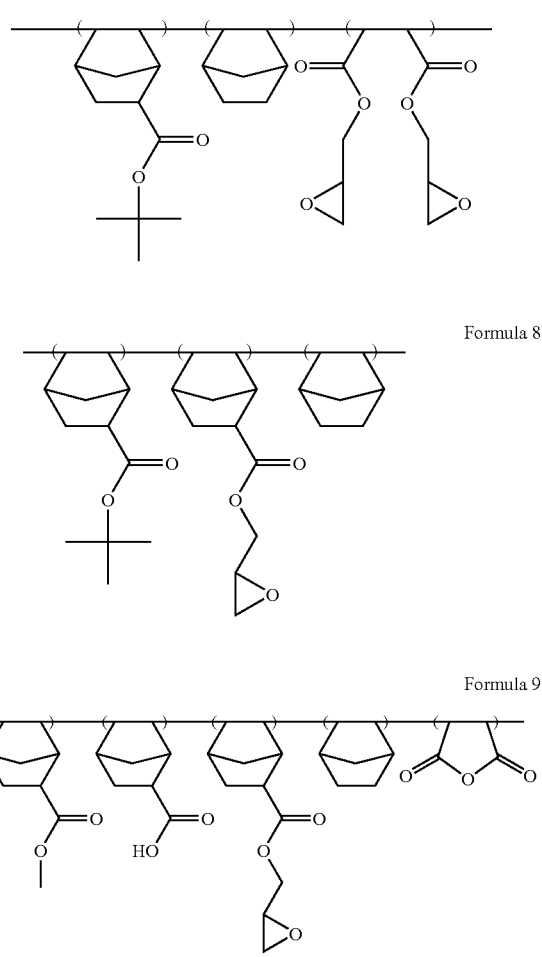

the method comprising the step of:
  forming a pattern using a photosensitive resin composition comprising:
    applying the photoresist composition on top of a substrate;
    pre-baking the photoresist composition and substrate to form a photoresist film;
    irradiating UV light with a mask;
    baking the irradiated photoresist film; and
    developing and washing the resulting pattern.

* * * * *